United States Patent
Fazzio et al.

(10) Patent No.: US 7,248,131 B2
(45) Date of Patent: Jul. 24, 2007

(54) MONOLITHIC VERTICAL INTEGRATION OF AN ACOUSTIC RESONATOR AND ELECTRONIC CIRCUITRY

(75) Inventors: R. Shane Fazzio, Loveland, CO (US); Thomas E. Dungan, Fort Collins, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 102 days.

(21) Appl. No.: 11/079,776

(22) Filed: Mar. 14, 2005

(65) Prior Publication Data

US 2006/0202779 A1    Sep. 14, 2006

(51) Int. Cl.
*H03H 9/54* (2006.01)
*H03H 9/05* (2006.01)
*H03H 3/02* (2006.01)

(52) U.S. Cl. ............... 333/187; 29/25.35; 257/499; 257/416; 438/23; 438/26; 438/50

(58) Field of Classification Search ......... 333/191–192
See application file for complete search history.

(56) References Cited

U.S. PATENT DOCUMENTS

| | | | |
|---|---|---|---|
| 5,260,596 A | 11/1993 | Dunn et al. | |
| 5,326,726 A | 7/1994 | Tsang et al. | |
| 5,504,026 A | 4/1996 | Kung | |
| 5,798,283 A | 8/1998 | Montague et al. | |
| 5,963,788 A | 10/1999 | Barron et al. | |
| 6,060,818 A | 5/2000 | Ruby et al. | |
| 6,133,674 A * | 10/2000 | Fry | 310/343 |
| 6,136,630 A | 10/2000 | Weigold et al. | |
| 6,285,866 B1 * | 9/2001 | Lee et al. | 455/318 |
| 6,355,498 B1 * | 3/2002 | Chan et al. | 438/48 |
| 6,531,331 B1 | 3/2003 | Bennett et al. | |
| 6,714,102 B2 | 3/2004 | Ruby et al. | |
| 6,767,749 B2 * | 7/2004 | Kub et al. | 438/3 |
| 6,842,088 B2 * | 1/2005 | Yamada et al. | 333/187 |
| 6,927,649 B2 * | 8/2005 | Metzger et al. | 333/133 |
| 7,057,477 B2 * | 6/2006 | Wang | 333/189 |
| 2002/0121337 A1 * | 9/2002 | Whatmore et al. | 156/285 |
| 2003/0090338 A1 | 5/2003 | Muramatsu | |
| 2003/0227357 A1 | 12/2003 | Metzger et al. | |
| 2004/0130410 A1 * | 7/2004 | Nishimura et al. | 333/133 |
| 2004/0145430 A1 * | 7/2004 | Metzger | 333/187 |
| 2004/0207490 A1 * | 10/2004 | Jun et al. | 333/187 |
| 2004/0257171 A1 * | 12/2004 | Park et al. | 333/133 |
| 2005/0012571 A1 * | 1/2005 | Song et al. | 333/192 |
| 2005/0128027 A1 * | 6/2005 | Song et al. | 333/133 |
| 2005/0195047 A1 * | 9/2005 | Park et al. | 333/133 |

FOREIGN PATENT DOCUMENTS

| | | |
|---|---|---|
| EP | 1 482 638 A3 | 5/2004 |
| EP | 1 508 936 A1 | 6/2004 |
| GB | 2 411 302 A | 8/2005 |

OTHER PUBLICATIONS

Search report from corresponding application No. GB0605018.1, Date of Search Jun. 15, 2006.

* cited by examiner

Primary Examiner—Barbara Summons (57) ABSTRACT

Monolithic devices that include an acoustic resonator vertically integrated with electronic circuitry are described. In one aspect, a monolithic integrated device includes a substrate, electronic circuitry supported by the substrate, an acoustic isolator over the electronic circuitry, and an acoustic resonator on the acoustic isolator. A method of fabricating the monolithic device also is described.

18 Claims, 8 Drawing Sheets

MONOLITHIC VERTICAL INTEGRATION OF AN ACOUSTIC RESONATOR AND ELECTRONIC CIRCUITRY

BACKGROUND

Many different acoustic resonator devices have been developed. Known Bulk Acoustic Wave (BAW) resonators include one or more piezoelectric layers disposed between two electrodes. For example, thin Film Bulk Acoustic wave Resonators (FBARs) typically include a single piezoelectric layer between two electrodes. Stacked thin film Bulk Acoustic wave Resonators (SBARs), on the other hand, typically include two piezoelectric layers disposed between top and bottom electrode layers and separated from each other by a middle electrode, which typically is used as a grounding electrode. Some acoustic resonator devices include multiple acoustic resonator devices that are isolated from one another by one or more isolation layers.

A BAW resonator has a resonant frequency that is determined primarily by is the thickness of the piezoelectric layer and secondarily by the thicknesses and the materials used for the other layers. A BAW resonator typically is acoustically isolated from the supporting substrate by an isolation structure, such as a cavity formed under a membrane supporting a BAW resonator or an acoustic mirror consisting of a stack of layers alternately formed of high and low acoustic impedance materials and having respective thicknesses of approximately one-quarter of the wavelength corresponding to the target resonant frequency of the device. A BAW resonator that is disposed on an acoustic mirror often is referred to as a solidly mounted resonator (SMR).

BAW resonators and the electronic circuitry that is used to sense or drive the BAW resonators typically are formed as separate components that are interconnected by an interconnection substrate, such as a printed circuit board. In one proposed approach, however, a thin film piezoelectric resonator and electronic circuitry are integrated laterally across the surface of the substrate. In general, any proposal for integrating such disparate components should give due consideration to the isolation (e.g., thermal isolation and contaminant isolation) of these components from incompatible processes. The proposal for laterally integrating the thin film piezoelectric resonator and electronic circuitry, however, does not describe how the processes that are used to fabricate the BAW resonator are isolated from the processes that are used to fabricate the electronic circuitry. Lateral integration may also require a larger die size which may result in increased device cost.

SUMMARY

In one aspect, the invention features a monolithic integrated device that includes a substrate, electronic circuitry supported by the substrate, an acoustic isolator over the electronic circuitry, and an acoustic resonator on the acoustic isolator.

In another aspect, the invention features a method of fabricating a monolithic integrated device. In accordance with this inventive method, electronic circuitry is formed on a substrate. An acoustic isolator is formed over the electronic circuitry. An acoustic resonator is formed on the acoustic isolator.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

The embodiments described in detail below vertically integrate acoustic resonators with electronic circuitry in a single monolithic device that provides significant advantages over devices in which the acoustic resonators and the electronic circuitry are implemented as separate components. The distances over which signals must travel between the acoustic resonator and the electronic circuitry in these embodiments are significantly shorter and the number of connections is significantly fewer than in non-integrated devices. As a result, the performance and sensitivity of these embodiments are significantly higher. In addition, these embodiments may be implemented by monolithic devices that are significantly smaller than non-integrated devices, and are characterized by higher manufacturing reliability and lower manufacturing costs. Furthermore, the vertical integration achievable by these embodiments increases the number of acoustic resonator components and electronic circuitry components that can be fabricated within a given area of the substrate relative to devices in which the acoustic resonators are laterally integrated with electronic circuitry.

I. Overview

Figure 1:
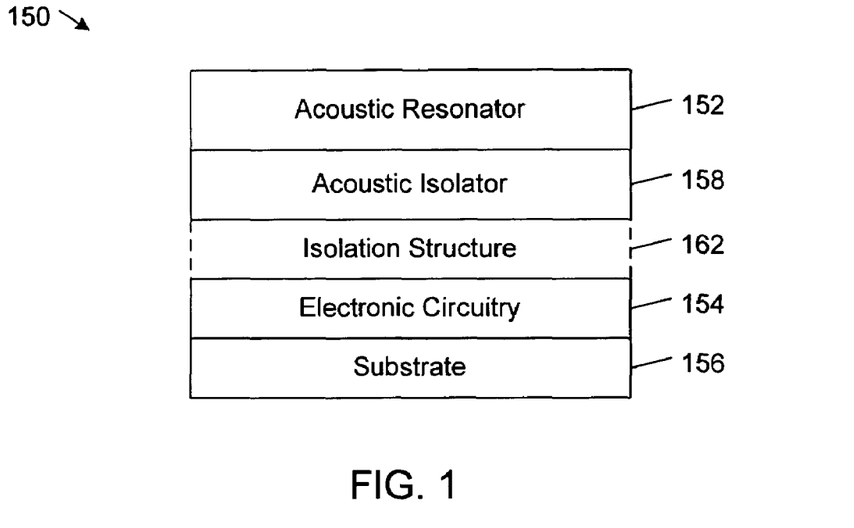
FIG. 1 is a block diagram of an embodiment of a monolithic device that includes electronic circuitry vertically integrated with an acoustic resonator.

FIG. 1 shows an embodiment of a monolithic device 150 that includes an acoustic resonator 152 that is vertically integrated with electronic circuitry 154 on a substrate 156. The acoustic resonator 152 is formed on an acoustic isolator 158. The acoustic isolator 158 may be, for example, a membrane formed over a cavity of a resonator-supporting structure or an acoustic mirror that includes a stack of layers that are alternately formed of high and low acoustic impedance materials and have respective thicknesses of approximately one-quarter of the wavelength corresponding to the target resonant frequency of the acoustic resonator 152. The acoustic isolator 158 acoustically isolates the acoustic resonator 152 from the electronic circuitry 154 and the supporting substrate 156.

Figure 2:
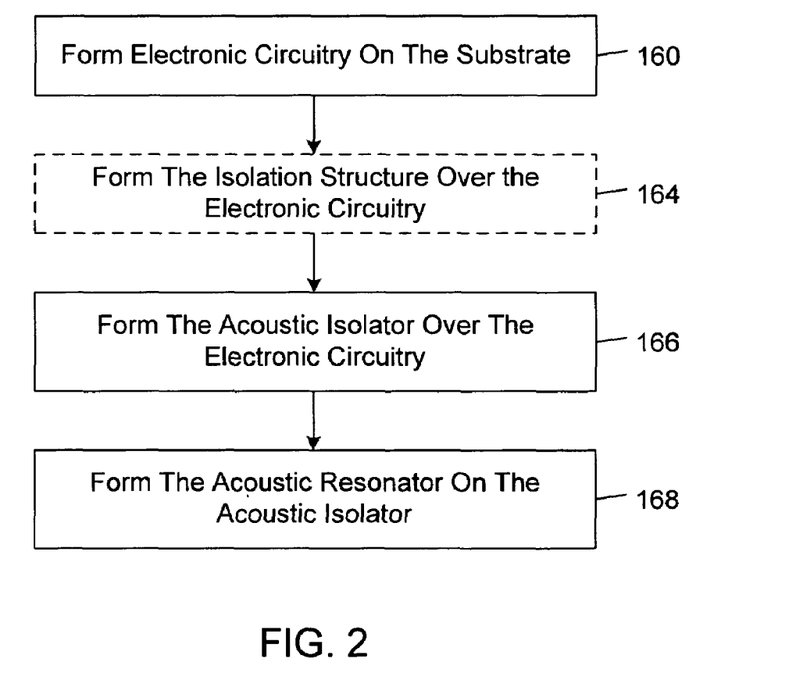
FIG. 2 is a flow diagram of an embodiment of a method of fabricating the monolithic device shown in FIG. 1.

FIG. 2 shows a flow diagram of an embodiment of a method of fabricating the monolithic integrated device 150. In accordance with this method, the electronic circuitry 154 is formed on the substrate 156 (block 160). As used herein, the term "electronic circuitry" refers to at least one electronic component along with any electrical connections between the electronic component and at least one of the acoustic resonator 12 and an external electrical contact. The electronic component may be an active component (e.g., a transistor) or a passive component (e.g., a resistor or a capacitor). The substrate 156 may be any type of substrate on which the various components of the monolithic device 150 may be formed, including a semiconductor substrate, a glass substrate, a sapphire substrate, and a ceramic substrate.

An optional isolation structure 162 may be formed between the acoustic isolator 158 and the electronic circuitry 154 to additionally isolate the acoustic resonator 152 from the electronic circuitry 154 (block 164). The isolation structure 162 may include one or more layers of material that increase the separation distance between the acoustic resonator 152 and the electronic circuitry 154. The isolation structure 162 may facilitate the vertical integration of the acoustic resonator 152 and the electronic circuitry 154 by protecting the underlying electronic circuitry 154 against damage that otherwise might be caused by the processes that are used to form the acoustic isolator 158 and the acoustic resonator 152. For example, the isolation structure 162 may protect the electronic circuitry 154 against high heat levels, high thermal gradients, and incompatible materials (e.g., contaminants) that may be generated or used during the formation of the acoustic isolator 158 and the acoustic resonator 152. The isolation structure also may reduce transmission of radio frequency noise signals between the electronic circuitry 154 and the acoustic resonator 152.

Next, the acoustic isolator 158 is formed over the electronic circuitry 154 (block 166). The acoustic resonator 152 is formed on the acoustic isolator 158 (block 168).

Figure 3:
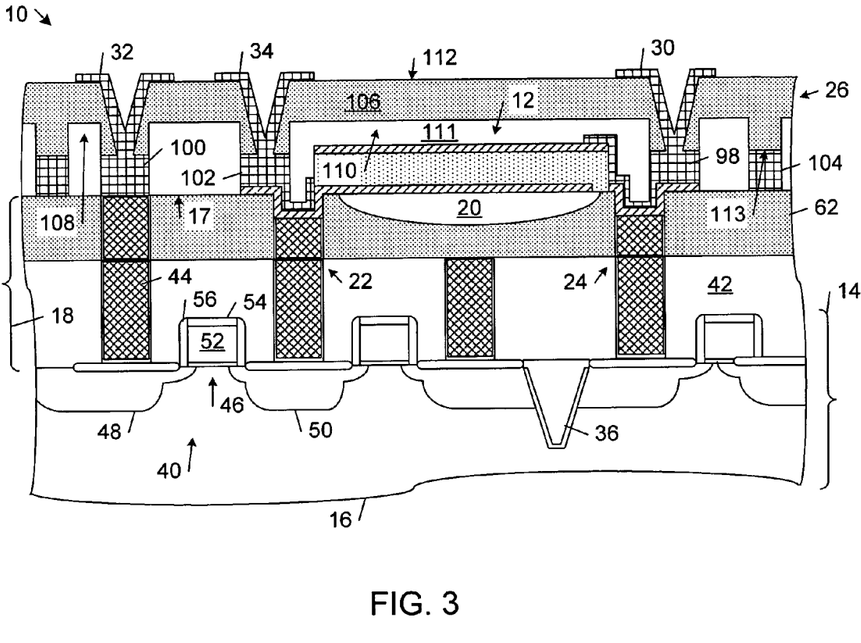
FIG. 3 is a diagrammatic sectional view of an embodiment of a monolithic device that includes electronic circuitry integrated with an acoustic resonator.

II. Monolithic Vertical Integration of a Cavity-Based Acoustic Resonator and Electronic Circuitry FIG. 3 shows an embodiment of a monolithic device 10 that includes an acoustic resonator 12 that is vertically integrated with electronic circuitry 14 on a substrate 16. The substrate 16 may be a semiconductor substrate (e.g., a silicon substrate). An isolation structure 18 that includes a depression 20 is formed over the electronic circuitry 14. The acoustic resonator 12 spans the depression 20 and is supported by a top surface 17 of the isolation structure 18. The acoustic resonator 12 is electrically connected to the electronic circuitry 14 by first and second electrically conductive paths 22, 24. A cap structure 26 hermetically seals and protects the acoustic resonator 12. The cap structure 26 also provides external contacts 30, 32, 34 that are connected electrically to the acoustic resonator 12 and the electronic circuitry 14. In embodiments in which the acoustic resonator 12 is passivated, the cap structure 26 may or may not hermetically seal the acoustic resonator 12 and, in some cases, may be omitted altogether.

Figure 4:
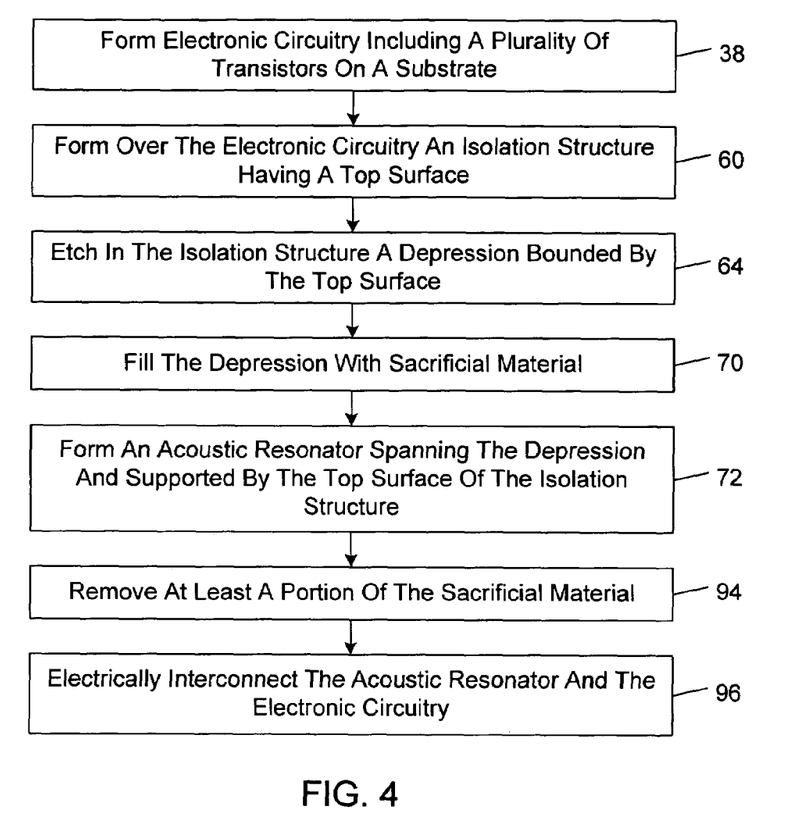
FIG. 4 is a flow diagram of an embodiment of a method of fabricating the monolithic integrated device shown in FIG. 3.

FIG. 4 shows an embodiment of a method of fabricating the monolithic device 10. Compatible ones of the processes that are used to fabricate the electronic circuitry 14 and the processes that are used to fabricate the acoustic resonator 12 may be performed in the same processing facility. Incompatible ones of these processes, however, are performed in separate processing facilities. Process compatibility is determined at least in part based on contamination considerations and thermal considerations.

Figure 5:
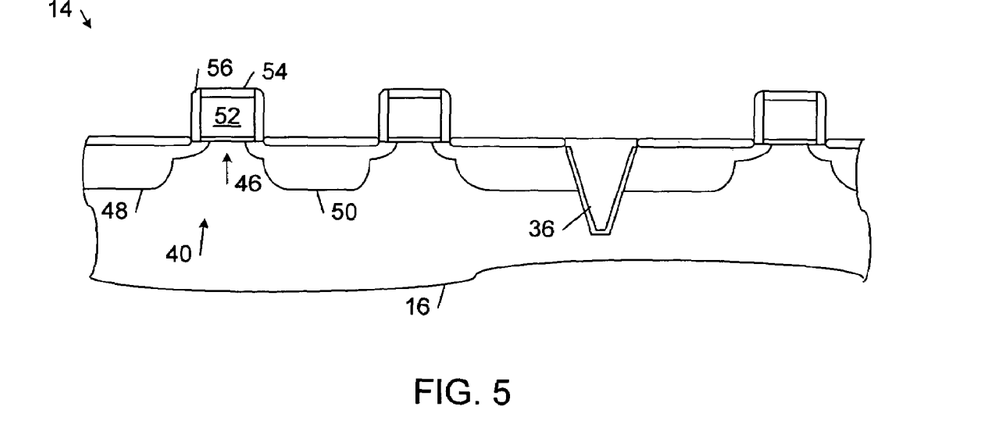
FIG. 5 is a diagrammatic sectional view of a substrate supporting electronic circuitry including at least one transistor.

Referring to FIGS. 4 and 5, the electronic circuitry 14 is formed on the substrate 16 (block 38). In general, the electronic circuitry 14 may be formed in accordance with any type of electronic circuit fabrication processes, including CMOS fabrication processes, bipolar transistor fabrication processes, BiCMOS fabrication processes, and III-V semiconductor fabrication processes. In the illustrated embodiment, the electronic circuitry 14 includes a plurality of transistors 40 that are supported by the substrate 16. Groups of transistors in different circuits are isolated from one another by isolation structures 36 (e.g., conventional shallow trench isolation structures).

In general, each transistor 40 includes a gate structure 46 and source/drain regions 48, 50. Each of the gate structures 46 includes a gate dielectric 52, a gate electrode 54, and a sidewall insulator 56. The gate dielectric 52 may be formed from silicon dioxide, an oxynitride, a silicon nitride, BST, PZT, a silicate, any other high-k material, or any combination or stack thereof. The gate electrode 54 may be formed from polycrystalline silicon doped either n-type or p-type with an overlying silicide layer or a metal, such as titanium, tungsten, TiN, tantalum or TaN. The sidewall insulator 56 may be formed from an oxide (e.g., silicon oxide), a nitride (e.g., silicon nitride), an oxynitride (e.g., silicon oxynitride), or a combination or stack thereof. The source/drain regions 48, 50 may be formed by conventional implantation techniques, and may include lightly-doped drain extensions and pocket implants. The source/drain regions 48, 50 also may be silicided (e.g., with titanium, cobalt, nickel, tungsten, or other conventional silicide material).

After the electronic circuitry 14 has been formed (block 38; FIG. 4), the isolation structure 18 is formed over the electronic circuitry 14 (block 60; FIG. 4).

Figure 6:
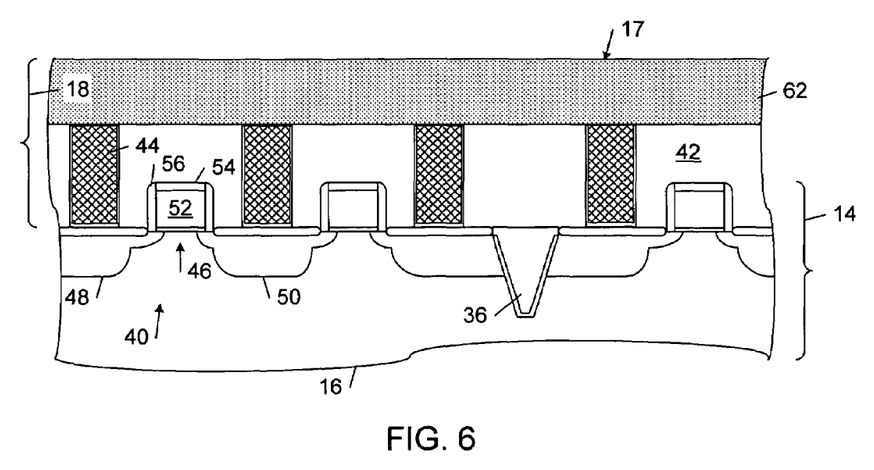
FIG. 6 is a diagrammatic sectional view of an isolation structure formed over the electronic circuitry shown in FIG. 5.

As shown in FIG. 6, in the illustrated embodiment, the isolation structure 18 includes a transistor isolation layer 42 and an overlying isolation layer 62. The electronic circuitry 14 and the transistor isolation layer 42 in this embodiment may be fabricated in one processing facility and the remaining device structures, including the isolation layer 62 may be formed in another processing facility. In other embodiments, the isolation layer 62 is omitted and all of the device processing steps may be performed in the same processing facility. In these embodiments, the processes for fabricating the acoustic resonator 12 are performed on the transistor isolation layer 42.

In the illustrated embodiment, the isolation layer 62 is formed on a planarized top surface of the transistor isolation layer 42. In other embodiments, the isolation layer 62 may be formed on an unplanarized surface of the transistor isolation layer 42. In some implementations, the transistor isolation layer 42 and the isolation layer 62 are formed from the same dielectric material (e.g., $SiO_2$, which may be doped or undoped). In other implementations, the transistor isolation layer 42 and the isolation layer 62 are formed from different dielectric materials. In some embodiments, a diffusion barrier or etch stop layer may be formed over one or both of the transistor isolation layer 42 and the isolation layer 62. The diffusion barrier/etch stop layer may be planarized by, for example, a conventional chemical mechanical polishing process. An additional diffusion barrier/etch stop layer may be formed over the planarized surface.

A plurality of contact vias 44 extend through the transistor isolation layer 42. The contact vias 44 are filled with conductive plugs that may be formed from a metal (e.g., tungsten, molybdenum, titanium, copper, aluminum, tin, gold, and silver), titanium nitride, tantalum nitride, or a metal silicide. A liner or barrier layer (e.g., a layer of Ti, TiN, TaSiN, Ta, TaN, TiSiN, a stack thereof, or other conventional liner/barrier material) may be formed between the conductive plugs and the dielectric material of transistor isolation layer 42. The contact vias 44 preferably are aligned with the silicided regions of source/drain regions 48, 50 and gate structures 46.

Figure 7A:
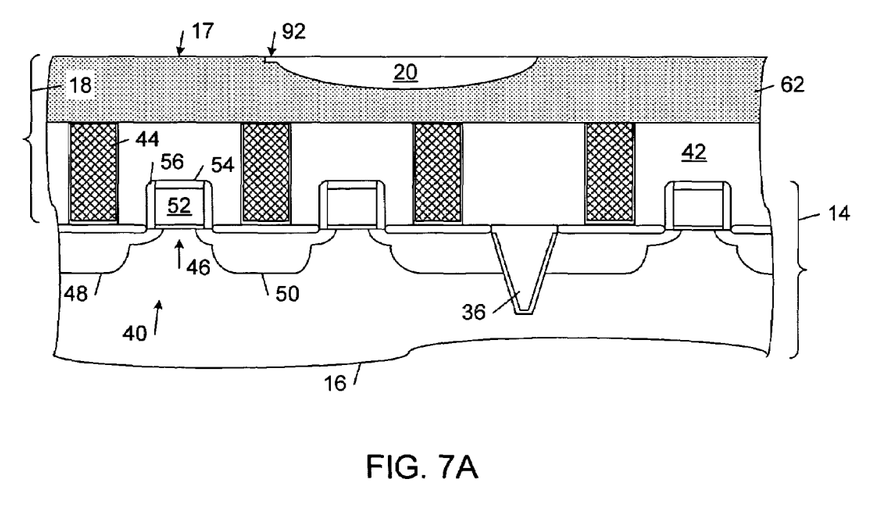
FIG. 7A is a diagrammatic sectional view of a depression and multiple release holes that are etched in the isolation structure shown in FIG. 6.

Referring back to FIG. 4 and to FIG. 7A, after the isolation structure 18 has been formed (block 60), the depression 20 is etched in the isolation structure 18 (block 64). In this process, the regions of the top surface 17 of the isolation layer 62 outside of the area where the depression 20 will be formed are masked by a patterned photoresist layer and the exposed (unmasked) area of the isolation layer 62 is etched using, for example, a dry etch process (e.g., a plasma etch). In general, the walls of the isolation layer 62 that form the boundaries of the depression 20 may have any shape. In some implementations, these walls are vertically oriented with respect to the top surface 17. The edges of the top surface 17 bounding the depression 20 form a polygonal shape (e.g., a quadrilateral or a pentagon), a curved shape, or any other shape.

Figure 7B:
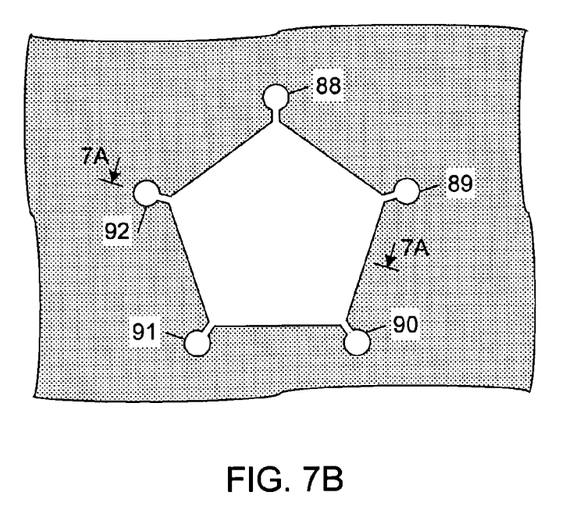
FIG. 7B is a top view of the depression shown in FIG. 7A.

As shown in FIGS. 7A and 7B, in some implementations, during the process of etching the depression 20, release holes 88, 89, 90, 91, 92 are formed along the peripheral edges of the depression 20. Respective channels connect the release holes 88-92 to the depression 20. In the illustrated embodiment, the depression has a pentagonal shape and the release holes 88-92 are formed at the pentagonal vertices. In other embodiments, release holes may be formed at other locations near the edges of the depression 20.

Figure 8:
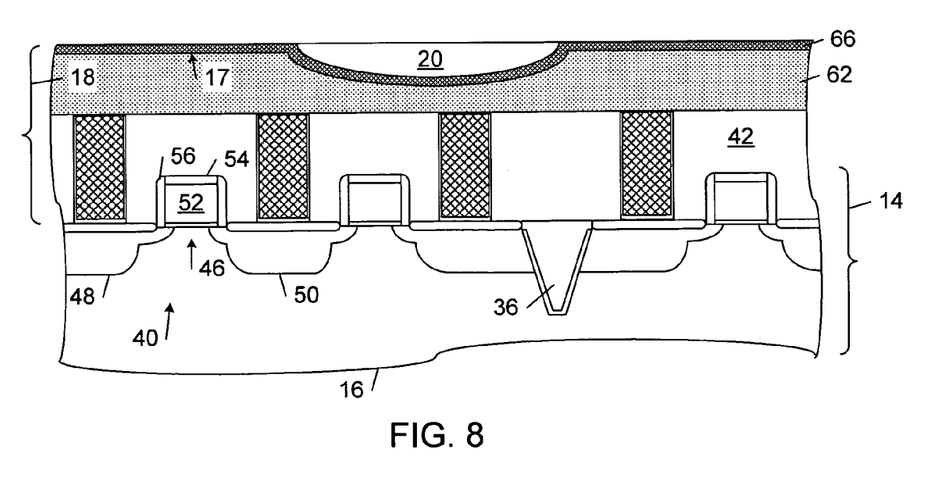
FIG. 8 is a diagrammatic sectional view of a barrier layer formed over the etched isolation structure shown in FIG. 7A.

As shown in FIG. 8, in some implementations, a barrier layer 66 is formed over at least the surfaces of the isolation layer 62 that define the depression 20. In the illustrated embodiment, the barrier layer 66 is formed over the entire top surface 17 of the isolation layer 62. In some implementations, the barrier layer 66 is present only on the surfaces that define the depression 20. The barrier layer 66 may be formed of a material that is selectively etchable with respect to the sacrificial material used to fill the depression in the process described below. For example, in embodiments in which the sacrificial material is phospho-silicate-glass (PSG), the barrier layer 66 may be formed of thermal $SiO_2$, LPCVD $Si_3N_4$, TiWON, $WSi_3N_4$, AlN, or sputtered silicon. In embodiments in which the isolation layer 62 is selectively etchable with respect to the sacrificial material, the barrier layer 66 may be omitted. In some instances, the barrier layer 66 also serves as a chemical mechanical polishing stop layer.

Figure 9:
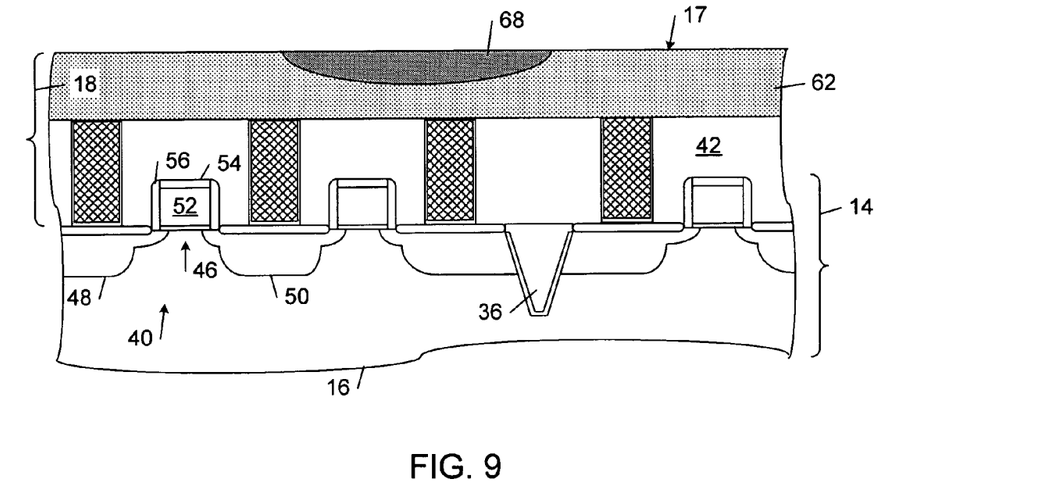
FIG. 9 is a diagrammatic sectional view of a planarized layer of sacrificial material filling the depression shown in FIG. 7A.

Referring to FIGS. 4, and 9, after the depression 20 has been etched (block 64), the depression 20 is filled with a sacrificial material 68 (block 70). The sacrificial material 68 may be any type of material that exhibits an etch selectivity with respect to the barrier layer 66 (if present) or the isolation layer 62. In some implementations, the sacrificial material is PSG. In these implementations, the PSG is deposited over the entire top surface 17 of the isolation layer 62. The PSG may be deposited at a temperature of about 400° C. using silane, nitrous oxide, and phosphine sources to form a PSG material that is approximately 8% phosphorous. As shown in FIG. 9, after it has been deposited, the PSG is polished to an atomically smooth surface that matches the level of the top surface 17 of the isolation layer 62. In other implementations, the sacrificial material may be selected from oxides (e.g., boro-phospho-silicate glass (BPSG) and spin-on-glass), nitrides, dielectrics (e.g., polyvinyl, polypropylene, and polystyrene), semiconductors (e.g., germanium), and metals (e.g., copper and aluminum). In some implementations, the barrier layer 66 serves as a diffusion barrier between the sacrificial material 68 and the underlying isolation layer 62.

Figure 10:
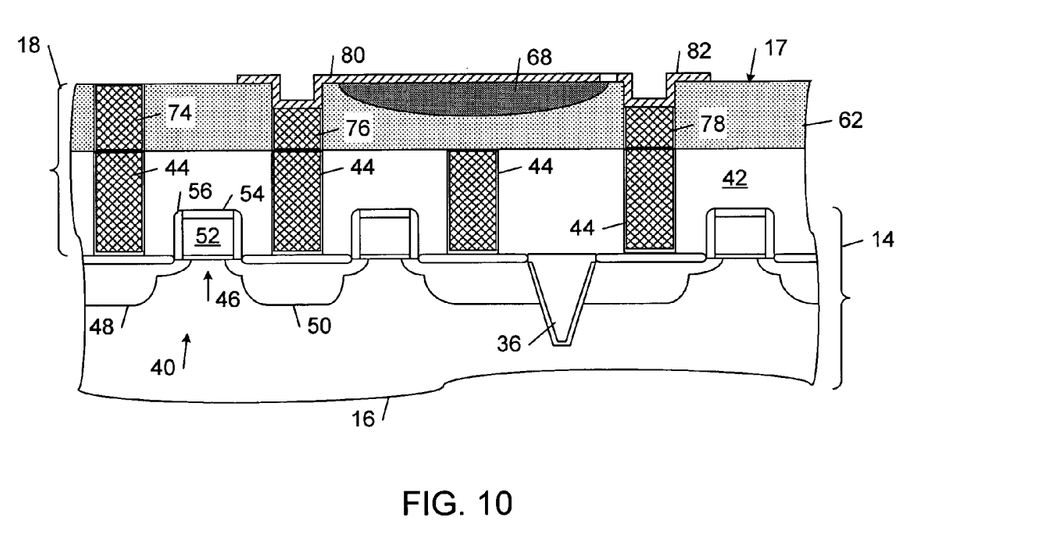
FIG. 10 is a diagrammatic sectional view of a bottom electrode of an acoustic resonator supported by the sacrificial material and the top surface of the isolation structure shown in FIG. 9.
Figure 11:
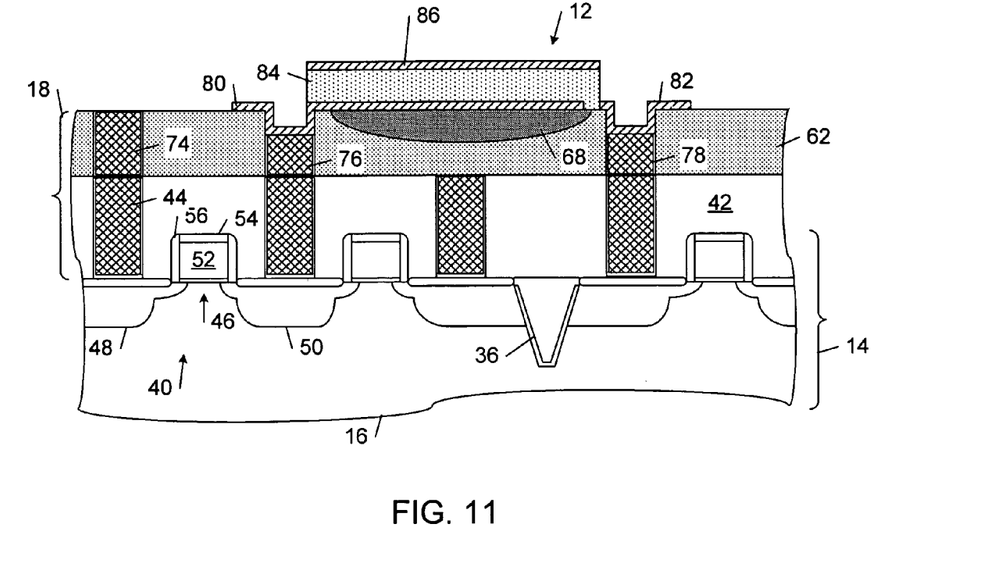
FIG. 11 is a diagrammatic sectional view of a completed acoustic resonator structure that includes the bottom electrode shown in FIG. 7A.

Referring to FIGS. 4, 10, and 11, after the depression 20 has been filled with the sacrificial material 68 (block 70), the acoustic resonator 12 is formed (block 72). During this process, contact vias 74, 76, 78 are opened in the isolation layer 62 and filled with electrically conductive plugs that are joined to the conductive plugs in the contact vias 44 extending through the transistor isolation layer 42. A patterned bottom electrode 80 of the acoustic resonator 12 is formed over the sacrificial material 68, the top surface 17 of the isolation layer 62, and the contact via 76, as shown in FIG. 10. A separate contact layer 82 is deposited over the contact via 78. A piezoelectric structure 84 is formed over the bottom electrode 80 and a top electrode 86 is formed over the piezoelectric structure 84. The bottom and top electrodes 80, 86 and the contact layer 82 may be formed of one of Mo, Al, Au, Pt, Ti, and alloys thereof. The piezoelectric structure 84 is formed of one or more layers of piezoelectric material. The one or more piezoelectric layers may be formed of a wurtzite-type hexagonal crystal, such as cadmium sulfide, cadmium selenide, zinc oxide, beryllium oxide, aluminum nitride, and wurtzite zinc sulfide, and solid solutions thereof, and lead-zirconate-titanate (PZT). Alternatively, the one or more piezoelectric layers may be formed of a non-wurtzite-type hexagonal crystal piezoelectric material, such as a sphalerite cubic crystal.

In the embodiment shown in FIGS. 10 and 11, the electrical connection between the electronic circuitry 14 and the bottom electrode 80 of the acoustic resonator 12 are made during the process of forming the acoustic resonator 12. In other embodiments, an electrical connection between the electronic circuitry 14 and the bottom electrode 80 may be made after the acoustic resonator 12 has been formed (e.g., during the metallization process described below in connection with block 96 of FIG. 4, or through an external circuit). In cases in which the acoustic resonator and the electronic circuitry 14 is made through an external circuit, the electrical connections through the first and second electrically conductive paths 22, 24 may be omitted.

Figure 12:
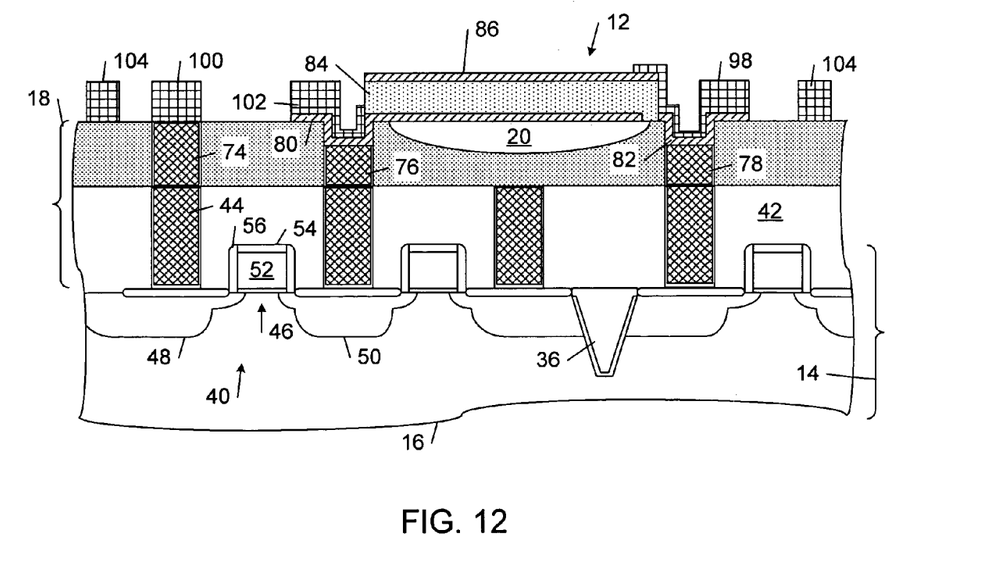
FIG. 12 is a diagrammatic sectional view of the acoustic resonator structure shown in FIG. 11 after the sacrificial material filling the depression has been removed and after a patterned metallization has been formed.

Referring to FIGS. 4 and 12, after the acoustic resonator 12 has been formed (block 72), at least a portion of the sacrificial material 68 filling the depression 20 is removed (block 94). In some implementations, the sacrificial material 68 is removed by flowing an etchant into the release holes 88-92. In implementations in which the sacrificial material 68 is PSG, the etchant may be a dilute $H_2O$:HF solution. In one implementation, the dilution ratio is 10:1:$H_2O$:HF. After the sacrificial material 68 has been removed, the peripheral regions of the acoustic resonator 12 are supported by the top surface 17 of the isolation layer 62 and the central portion of the acoustic resonator 12 spans the depression 20.

The acoustic resonator 12 then is electrically connected to the electronic circuitry 14 (block 96). In the illustrated embodiment, the bottom electrode 80 is electrically connected to the electronic circuitry 14 during the process of forming the bottom electrode 80 over the contact via 76. The top electrode 86 is electrically connected to the electronic circuitry 14 by depositing a metallization 98 between the top electrode 86 and the electrically conductive contact layer 82 which contacts the electrically conductive plug in contact via 78. In the illustrated embodiment, metallizations 100, 102, 104 also are formed during this process. The metallizations 98, 100, 102 provide electrical contacts between the external contacts 30, 32, 34 and the acoustic resonator 12 and the electronic circuitry 14. The metallization 104 provides structural support for the cap structure 26. In some implementations, the metallization 104 forms a ring around the periphery of the acoustic resonator 12 and its associated circuitry. In some embodiments, the metallizations 98, 100, 102, 104 are bond metallizations.

In some implementations, for example, in which the cap structure 26 does not form a hermetic seal over the acoustic resonator 12 or in which the cap structure 26 is omitted altogether, one or more of the metallizations 98, 100, 102, 104 may be omitted.

Referring back to FIG. 3, the cap structure 26 includes a substrate 106 (e.g., a wafer of semiconductor material, such as silicon) that includes a bottom side 108 that has a recess 110 that defines a top part of a cavity 111, and a top side 112 that has vias through which the external contacts 30, 32, 34 extend to the metallizations 98, 100, 102. In this way, the external contacts 30, 32, 34 provide electrical connections between external circuits and the acoustic resonator 12 and the electronic circuitry 14. The bottom side 108 of the cap structure 26 also includes a ring ridge 113 that extends around the periphery of the acoustic resonator 12 and its associated circuitry. The ring ridge 113 is bonded to the bond metallization 104. In some implementations, the bond between the metallization 104 and the ring ridge 113 hermetically seals the acoustic resonator 12. An additional metallization also may be deposited on the cap structure 26. In some implementations, the cap structure 26 may be bonded to the substrate 16 using a non-metal bond material, such as benzocyclobutene (BCB), polyimide, or an amorphous fluorocarbon polymer (e.g., CYTOP®).

Figure 13:
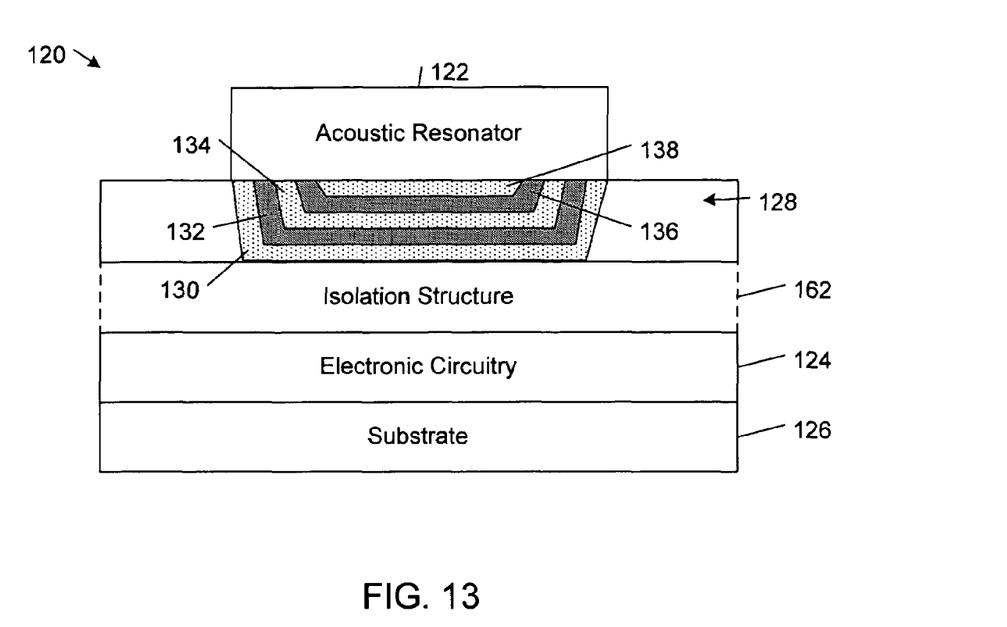
FIG. 13 is a diagrammatic view of an embodiment of a monolithic device that includes electronic circuitry vertically integrated with an acoustic resonator.

III. Monolithic Vertical Integration of an Acoustic Mirror Based Acoustic Resonator and Electronic Circuitry FIG. 13 shows an embodiment of a monolithic device 120 that includes an acoustic resonator 122 that is formed integrally with electronic circuitry 124 on a substrate 126. The structure of the monolithic device 120 is essentially the same as the structures of the monolithic devices described above, except the acoustic isolator 128 is an acoustic mirror. In particular, the acoustic isolator 128 includes a stack of layers 130, 132, 134, 136, 138 that are alternately formed of high and low acoustic impedance materials. The layers 130-138 have respective thicknesses that are approximately one-quarter of the wavelength corresponding to the target resonant frequency of the acoustic resonator 122. Other embodiments may use more than five layers to form the acoustic mirror. Other embodiments may use less than five layers to form the acoustic mirror. In some exemplary implementations, the acoustic isolator 128 is formed of alternating layers of silicon oxide and tungsten or alternating layers of silicon oxide and molybdenum.

Figure 14:
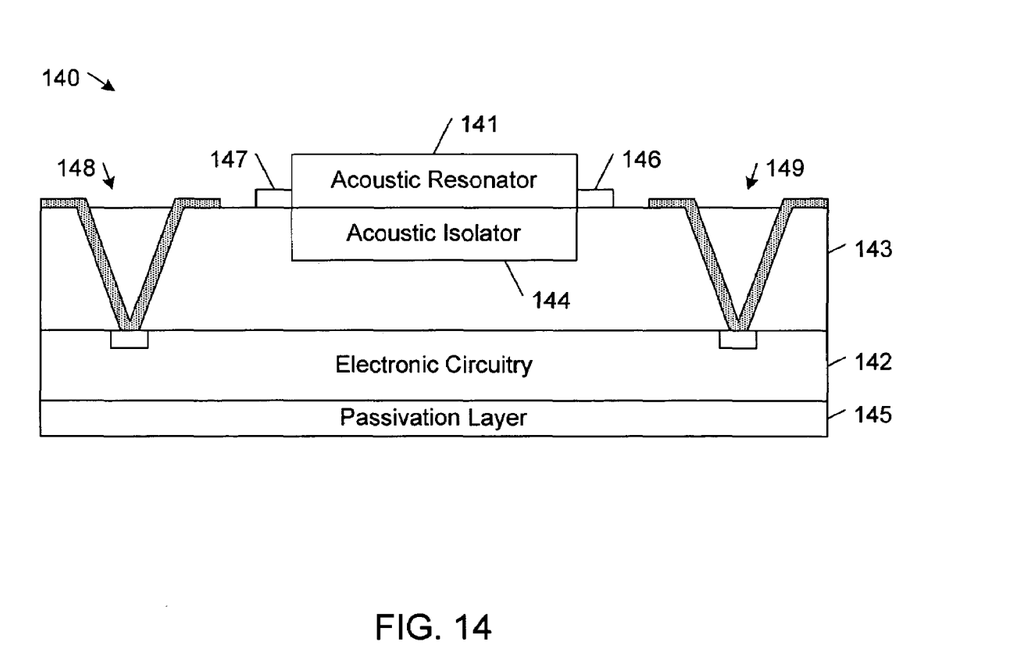
FIG. 14 is a diagrammatic view of an embodiment of a monolithic device that includes electronic circuitry vertically integrated with an acoustic resonator.

IV. Monolithic Vertical Integration of an Acoustic Resonator and Electronic Circuitry on Opposite Sides of a Substrate FIG. 14 shows an embodiment of a monolithic device 140 that includes an acoustic resonator 141 that is formed integrally with electronic circuitry 142 on opposite sides of a substrate 143. The acoustic resonator 141 is formed on an acoustic isolator 144. The acoustic isolator 144 may be, for example, a membrane formed over a cavity of a resonator-supporting structure or an acoustic mirror, as described above. The electronic circuitry is passivated by an overlying passivation layer 145, which may be formed of, for example, a dielectric material, such as an oxide (e.g., silicon oxide) or a nitride (e.g., silicon nitride). The acoustic resonator 141 includes a pair of electrical contacts 146, 147. The electronic circuitry 142 may be electrically connected to the resonator side of the substrate 143 by a pair of contact vias 148, 149 that include respective metallizations. In some embodiments, the electronic circuitry is electrically connected through the bottom of the substrate 143 (i.e., through the electronic circuitry side of substrate 143). The contact vias 148, 149 extend through the substrate 143 to respective ones of the metallization lines of the electronic circuitry 142.

In some implementations, the electronic circuitry 142 is formed and passivated by the passivation layer 145 on one side of the substrate 143 before the acoustic isolator 144 and the acoustic resonator 141 are formed on the opposite side of the substrate 143. The substrate 143 optionally may be thinned (e.g., by chemical mechanical polishing) before the acoustic isolator 144 and the acoustic resonator 141 are formed. Depending on the implementation of the acoustic resonator 141, the acoustic resonator 141 may be passivated by an overlying passivation layer, or a cap structure of the type described above may be attached to the substrate 143 over the acoustic resonator 141.

Other embodiments are within the scope of the claims.

What is claimed is:

1. A monolithic integrated device, comprising:
   a semiconductor substrate;
   electronic circuitry comprising at least one transistor that is supported by the substrate and has an electrical contact;
   an isolation structure comprising an acoustic isolator, electrically insulating material on the electronic circuitry, and a via extending from the electrical contact through the electrically insulating material;
   an acoustic resonator supported by the isolation structure over the acoustic isolator, wherein the acoustic resonator comprises a piezoelectric structure between first and second electrodes; and
   an electrically conductive path extending through the via and electrically connecting the electronic circuitry to one of the first and second electrodes of the acoustic resonator.

2. The device of claim 1, wherein the acoustic isolator comprises an acoustic mirror.

3. The device of claim 1, wherein a top surface of the isolation structure is planarized and supports the acoustic resonator.

4. The device of claim 1, wherein the acoustic isolator comprises a depression and the acoustic resonator spans the depression.

5. The device of claim 4, further comprising a barrier layer over surfaces of the acoustic isolator defining the depression.

6. The device of claim 4, further comprising at least one release hole extending to a cavity bounded by the depression and the acoustic resonator.

7. The device of claim 1, further comprising a cap structure over the acoustic resonator, wherein the cap structure comprises at least one electrical contact electrically connected to at least one of the acoustic resonator and the electronic circuitry.

8. The device of claim 1, wherein the electronic circuitry is on an opposite side of the substrate as the acoustic isolator and the acoustic resonator.

9. A method of fabricating a monolithic integrated device, comprising:
forming electronic circuitry on a semiconductor substrate, wherein the electronic circuitry comprises at least one transistor that is supported by the substrate and has an electrical contact;
forming an isolation structure over the electronic circuitry, wherein the isolation structure comprises an acoustic isolator, electrically insulating material on the electronic circuitry, and a via extending from the electrical contact through the electrically insulating material;
forming an acoustic resonator supported by the isolation structure over the acoustic isolator, wherein the acoustic resonator comprises a piezoelectric structure between first and second electrodes; and
forming an electrically conductive path extending through the via and electrically connecting the electronic circuitry to one of the first and second electrodes of the acoustic resonator.

10. The method of claim 9, further comprising providing a cap structure to create a sealed cavity containing the acoustic resonator, and forming at least one electrical contact on the cap structure and electrically connecting the electrical contact to at least one of the acoustic resonator and the electronic circuitry.

11. The method of claim 9, wherein the electronic circuitry is formed on a first side of the substrate and the acoustic isolator and the acoustic resonator are formed on a second side of the substrate opposite the first side.

12. The method of claim 9, wherein the forming of the acoustic isolator comprises forming an acoustic mirror over the electronic circuitry.

13. The method of claim 9, further comprising electrically interconnecting the acoustic resonator and the electronic circuitry.

14. The method of claim 9, wherein the forming of the acoustic isolator comprises etching a depression in the isolation structures and filling the depression with sacrificial material, at least a portion of the acoustic resonator being formed over the sacrificial material.

15. The method of claim 14, further comprising, after the acoustic resonator is formed, removing at least a portion of the sacrificial material to create a cavity under the acoustic resonator.

16. The method of claim 14, further comprising, before the filling, forming a barrier layer over a surface of the isolation structure defining the depression, wherein the barrier layer is selectively etchable with respect to the sacrificial material.

17. The method of claim 14, wherein the removing comprises exposing at least a portion of the sacrificial material in the depression to an etchant.

18. The method of claim 17, wherein the etching comprises etching at least one release hole extending to the sacrificial material in the depression, and the removing comprises flowing the etchant through the release hole.

* * * * *